(12) United States Patent
Murray et al.

(10) Patent No.: US 7,169,245 B2
(45) Date of Patent: Jan. 30, 2007

(54) METHODS OF USING SONICATION TO COUPLE A HEAT SINK TO A HEAT-GENERATING COMPONENT

(75) Inventors: Cameron T. Murray, Lake Elmo, MN (US); Jeffrey W. McCutcheon, Baldwin, WI (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 11/010,912

(22) Filed: Dec. 13, 2004

(65) Prior Publication Data
US 2006/0128068 A1    Jun. 15, 2006

(51) Int. Cl.
*B32B 37/00*    (2006.01)

(52) U.S. Cl. ............... 156/73.1; 156/73.5; 156/73.6; 438/120; 428/626

(58) Field of Classification Search ........... 156/73.1, 156/73.5, 73.6, 580.1, 580.2; 438/120; 428/625, 428/626
See application file for complete search history.

(56) References Cited

U.S. PATENT DOCUMENTS

| | | | |
|---|---|---|---|
| 4,145,390 A | 3/1979 | Zschimmer | |
| 4,954,313 A | 9/1990 | Lynch | |
| 5,690,766 A | 11/1997 | Zwick | |
| 6,132,850 A | 10/2000 | Hermansen et al. | |
| 6,228,689 B1 | 5/2001 | Liu | |
| 6,451,155 B1 * | 9/2002 | Toy et al. .................. 156/325 |
| 6,774,482 B2 | 8/2004 | Colgan et al. | |
| 6,855,578 B2 * | 2/2005 | Odegard et al. ............ 438/120 |
| 2004/0033643 A1 | 2/2004 | Odegard et al. | |
| 2004/0070070 A1 | 4/2004 | Sung | |
| 2005/0133934 A1 | 6/2005 | Mellody et al. | |

FOREIGN PATENT DOCUMENTS

| | | |
|---|---|---|
| DE | 1 800 213 | 5/1970 |
| JP | 11054684 | 2/1999 |
| JP | 11097599 | 4/1999 |
| JP | 20000135559 | 5/2000 |
| JP | 2004014599 | 1/2004 |
| WO | WO 03/036692 A2 | 5/2003 |

OTHER PUBLICATIONS

Literature: "Arctic Silver® 5", Arctic Silver Incorporated, <http://www.arcticsilver.com/as5.htm> (retrieved from the internet on Nov. 2, 2004).
Literature: "Deciding on a heat sink attachment method", Technology Watch/Production, Electronics Engineer, Apr. 1999.
Literature: "Calculations for Thermal Interface Materials", Electronics Cooling, The Central Resource for Practitioners in the Field of Electronics Thermal Management, <http://www.electronics-cooling.com/html/2003_august_calccorner.html> (retrieved from the internet on Sep. 14, 2003).

(Continued)

*Primary Examiner*—James Sells
(74) *Attorney, Agent, or Firm*—Thomas M. Spielbauer

(57) ABSTRACT

Methods of using subsonic and/or sonic forces to couple a heat sink to a heat-generating component are described. Heat sinks coupled to heat-generating components via thermal interface materials are also described.

20 Claims, 10 Drawing Sheets

OTHER PUBLICATIONS

Literature: "Thermal Interface Materials", Electronics Cooling, The Central Resource for Practitioners in the Field of Electronics Thermal Management, <http://www.electronics-cooling.com/html2003_november_al.html> (retrieved from the internet on Nov. 2, 2004).

Literature: "Thermal Interface Materials: A Brief Review of Design Characteristics and Materials", Electronics Cooling, The Central Resource for Practitioners in the Field of Electronics Thermal Management, <http://www.electronics-cooling.com/html/2004_february_al.html> (retrieved from the internet on Oct. 13, 2004).

Hermansen et al., "Formulating Custom-Tailored Thermal Transfer Adhesives", Adhesives Age, Oct. 1989, pp. 38-41.

Huang et al., "Influece of ultrasonics on upsetting of a model paste", ELSEVIER, Ultrasonics 40 (2002), pp. 43-48.

Redd et al., "Joining of Packaging and Thermal Management Materials Using Active Solders", Advancing Microelectronics—Nov./Dec. 2004, pp. 12-14.

Farris, "Prediction of the Viscosity of Multimodal Suspensions from Unimodal Viscosity Data", Transactions of the Society of Rheology 12:2, pp. 281-301 (1968).

Literature: "Thermal Interface Materials G-751", ShinEtsuMicroSi, Revised Sep. 17, 2003.

Solbrekken et al., "The Development of a Tool to Predict Package Level Thermal Interface Material Performance" (date unknown but believed to be prior to the date of the filing of the present application).

"The Effect of Fillers on Rheological Properties of Filled Materials", Handbook of Fillers, $2^{nd}$ Ed., Chapter 9, pp. 461-484 (1999).

Literature: "T-grease 2500, Thermally Conductive Grease", Thermagon, Inc., Dec. 19, 2003.

Publication: Tavman, "Thermal Conductivity of Particle Reinforced Polymer Composites", pp. 449-455 <www.drexel.edu/coe/research/conferences/natoasi2003/manuscripts/4.5.3%20tavman.pdf> (retrieved from the internet prior to the date of the filing of the present application).

Early et al., "Thermal Performance of Interface Material in Microelectronics Packaging Applications", 1995 IEPS Conference, pp. 534-544.

Literature: "Ultrasonic Processing of Materials", Project Summary Form (CPS 1784), FY 2004 Materials, Sensors, & Automation Project Preview <www.oit.doe.gov/imf/pdfs/1784ultrasonicprocessingsum.pdf> (retrieved from the internet prior to the date of the filing of the present application).

International Search Report for PCT/US2005/038295.

\* cited by examiner

METHODS OF USING SONICATION TO COUPLE A HEAT SINK TO A HEAT-GENERATING COMPONENT

FIELD

The invention pertains to heat sinks coupled to heat-generating components via thermal interface materials and to methods of coupling such components using sonication.

BACKGROUND

The current trend in electronics is to reduce the size and increase the number of components, e.g., integrated circuit chips (IC chips) mounted per unit area of a substrate, e.g., a printed circuit board (PCB). Generally, these components generate heat that, if allowed to build up, can cause failure of a component if its temperature exceeds some threshold level. Typically, heat sinks are used to accelerate the dissipation of thermal energy from these heat-generating components.

Generally, the heat sink is attached to the substrate with mechanical devices such as, e.g., rivets, clips, clamps, and threaded fasteners such that the heat sink is in alignment with and urged toward the heat-generating component. Surface irregularities in both the component surface and the opposing heat sink surface prevent perfect contact between them. The resulting air gaps act as a heat insulator and reduce the efficiency of heat transfer. Typically, a thermal interface material (TIM) is interposed between the component surface and the opposing heat sink surface in an attempt to displace the air, fill the irregularities in the surfaces, and improve the efficiency of heat transfer.

Generally, a TIM comprises a binder and one or more thermally conductive fillers. The overall thermal efficiency of an assembly comprising the heat-generating component, the TIM, and the heat sink is affected by the bulk thermal conductivity and the thickness of the TIM, as well as the ability of the TIM to wet-out the surfaces, displace air, and fill in the surface irregularities. Often a static pressure is applied to the assembly to urge the heat sink toward the heat-generating component, thus decreasing the thickness of the TIM and, in some cases, improving wet-out. However, practical considerations, such as the mechanical strength of the heat-generating component, limit the maximum allowable applied pressure.

Typically, increasing the loading of thermally conductive fillers in the binder increases the bulk thermal conductivity of the TIM. However, increasing the loading of filler also increases the viscosity of the TIM, thus increasing the static force and/or the time required to achieve a given reduction in thickness of the TIM. The higher loading may also prevent the TIM from reducing in thickness to the desired value under the applied pressure. Thus, despite increasing the bulk thermal conductivity of a TIM, increasing the filler loading could actually increase the thermal resistance of an assembly.

SUMMARY

Briefly, in one aspect, the present invention provides a method of coupling a heat sink to a heat-generating component comprising the steps of (a) providing a thermal interface material between at least a portion of a first major surface of the heat sink and at least a portion of a first major surface of the heat-generating component; and (b) urging the heat sink toward the heat-generating component while subjecting the thermal interface material to at least one of subsonic forces, sonic forces, or combinations thereof.

In some embodiments, the thermal interface material comprises a resin such as silicones, polyol esters, polyester polyols, polyesters, fluoropolymers, urethanes, acrylics, epoxies, and copolymers and combinations thereof. In some embodiments, the thermal interface material comprises an inorganic binder such as metals, metal alloys, solders, and combinations thereof. In some embodiments, the thermal interface material further comprises a plurality of thermally conductive particles.

In some embodiments, the method further comprises removing resin or inorganic binder from between the heat sink and the heat-generating component thereby increasing the concentration of thermally conductive particles in the thermal interface material remaining between the heat sink and the heat-generating component.

In another aspect, the present invention provides a heat sink assembly comprising (a) a layer of thermal interface material between at least a portion of a first major surface of a heat sink and at least a portion of a first major surface of a heat-generating component, wherein (i) the first major surfaces of the heat sink and the heat-generating component are substantially flat, (ii) the thermal interface material comprises at least 80% by volume thermally conductive particles, and (iii) the average thickness of the layer of thermal interface material is less than about 50 microns; and (b) a mechanical device applying a static pressure urging the heat sink toward the heat-generating component, wherein the static pressure is less than 172 kPa.

The above summary of the present invention is not intended to describe each embodiment of the present invention. The details of various embodiments of the invention are also set forth in the description below. Other features, objects, and advantages of the invention will be apparent from the description and from the claims.

DETAILED DESCRIPTION

Thermal interface materials (TIMs) are used to couple a heat sink to a heat-generating component, e.g., an integrated circuit chip (IC chip), or a light emitting diode (LED). In some embodiments, the heat-generating component can be a bare die or a packaged die (e.g., a die packaged in a metal, plastic, or ceramic material.) In some embodiments, the package may include additional heat transfer features (e.g., heat slugs and heat spreaders). In some embodiments, the heat sink may be coupled directly to the die. In some embodiments, the heat sink is coupled to the package or to some other element, which element is coupled, directly or indirectly, to the die. As used herein, the term "heat sink" includes other heat transfer components such as, e.g., heat pipes, heat spreaders, other heat dissipating means, or interconnections to a heat dissipating means. A TIM may be present between any two adjacent elements in the assembly; thus, more than one TIM layer may be present.

Figure 1A:
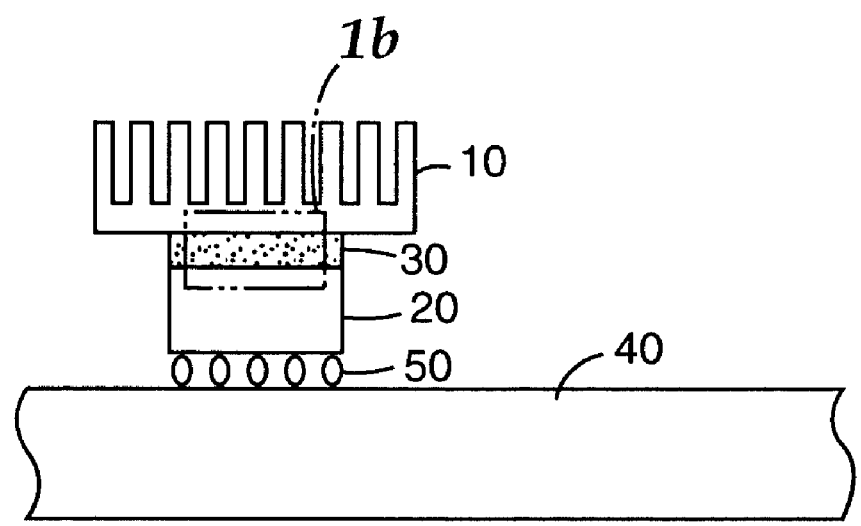
FIG. 1a illustrates a typical heat sink coupled to an integrated circuit chip via a thermal interface material.
Figure 1B:
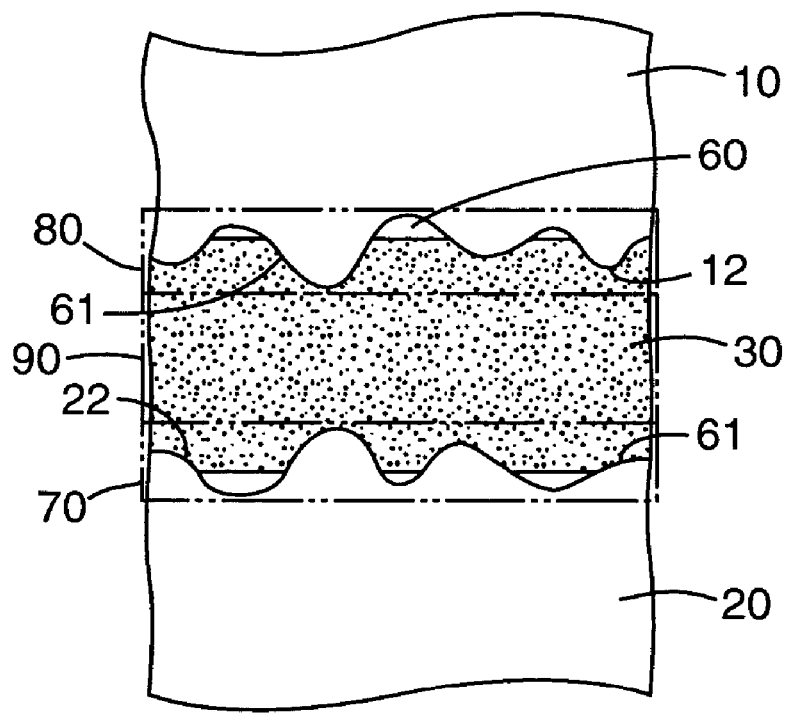
FIG. 1b is an expanded view of the interfaces between the thermal interface material and the surfaces of the heat sink and the integrated circuit chip.

Referring to FIGS. 1a and 1b, heat sink 10 is coupled to IC chip 20 via layer of TIM 30. In some embodiments, IC chip 20 is bonded to substrate 40, which may be, e.g., a flexible circuit or a printed circuit board. In some embodiments, IC chip 20 is bonded to substrate 40 via solder bumps 50. In some embodiments, an underfill adhesive (not shown), located between IC chip 20 and substrate 40, may be used to aid in bonding the chip to the substrate.

FIG. 1b is an expanded view of the interfaces between TIM 30 and heat sink surface 12 and IC chip surface 22. In some embodiments, both heat sink surface 12 and IC chip surface 22 are substantially flat. That is, both surfaces are free from discretely formed grooves, channels, crosshatch patterns, and the like.

Even when both surfaces are substantially flat, both heat sink surface 12 and IC chip surface 22 may contain random surface irregularities 61, e.g., peaks and valleys. Generally, if heat sink surface 12 and IC chip surface 22 were brought into direct contact, these irregularities would reduce the contact area and result in air gaps between the surfaces. The reduced contact area and the air gaps would reduce the efficiency of heat transfer.

As shown in FIG. 1b, generally TIM 30 at least partially fills in some of the irregularities 61. In some embodiments, TIM 30 substantially fills in most, and in some embodiments substantially all, of the irregularities 61. Depending on the properties of the TIM (e.g., the viscosity) and the method of coupling heat sink 10 to IC chip 20 (e.g., the static pressure applied) some air gaps 60 may remain.

A typical TIM comprises a binder and, optionally, fillers such as thermally conductive fillers. Generally, any known binder or combination of binders may be used to form the TIM. In some embodiments, one or more resins are used as binders. Exemplary resins include silicones, polyol esters, polyester polyols, polyesters, fluoropolymers, urethanes, acrylics, epoxies, and copolymers and combinations thereof. In some embodiments, inorganic binders may be used. Exemplary inorganic binders include metals, including low melting point metals, metal alloys, solders, and combinations thereof.

Additional exemplary binders include perfluorochemical oils, silicone oils, and non-silicone oils. In some embodiments, low surface tension binders are preferred. Generally, binders with low surface tension wet-out surfaces better, which may result in improved thermal conductivity across the interface.

Generally, any known thermally conductive filler, or combination of fillers may be used in the TIM. In some embodiments, the addition of thermally conductive fillers will affect the mechanical and physical properties of the invention but one skilled in the art can adjust formulas, filler amounts, and filler surface treatments to provide both thermal conductivity and suitable performance.

In some embodiments, the thermally conductive fillers are selected from a variety of materials having a bulk conductivity of between 5 and 2500 Watts/meter-K as measured according to ASTM D1530. Examples of suitable thermally conductive fillers include but are not limited to carbon, including, e.g., diamond; metals (e.g., aluminum, copper, gold, nickel, and silver); ceramics; oxides (e.g., aluminum and titanium oxide); nitrides (e.g., aluminum and boron nitride); carbides (e.g., aluminum and silicon carbide); hydroxides (e.g., aluminum hydroxide); and the like.

Fillers are found in a variety of shapes (e.g., spheres, flakes, platelets, powders, agglomerates, crystals, acicular, and fibers), crystal types (e.g., hexagonal and rhombic boron nitride), sizes, and size distributions. Generally, combinations of fillers, and filler shapes, crystal types, sizes and size distributions may be used.

The properties of the TIM play a critical role in the overall heat transfer efficiency of a heat transfer assembly comprising a heat-generating component, a TIM, and a heat sink. Generally it is desirable to minimize the resistance to heat flow from the heat-generating component to the heat sink, across the TIM. Referring to FIG. 1b, there are three primary sources of thermal resistance related to the TIM: (1) the interface between the TIM and the surface of the heat-generating component (region 70), (2) the interface between the TIM and the surface of the heat sink (region 80), and (3) the bulk of the TIM (region 90).

One factor in reducing the thermal resistance at the interfaces between the TIM and the surfaces of the heat-generating component and the heat sink is the ability of the TIM to flow and fill the surface irregularities in the surfaces. As the TIM fills in these irregularities, the binder and optional fillers forming the TIM displace air present in these irregularities. As the TIM typically has a significantly lower resistance to heat transfer than air, the resistance to heat transfer at the interfaces is substantially reduced.

Generally, all other things being equal, a TIM that is better able to flow into the irregularities and displace air will result in a lower resistance to heat transfer at the interfaces than a TIM that is less able to do so. Similarly, a process for coupling a heat sink to a heat-generating component that is better able to force the TIM into the irregularities and displace entrapped air will result in a lower resistance to heat transfer at the interfaces than a process less able to force the TIM to flow.

The resistance to heat flow through the bulk of the TIM ($R_T$) is proportional to the thickness of the TIM layer (L) divided by the bulk thermal conductivity of the TIM (k), as shown in Equation 1

$$R_T = \frac{L}{k}. \tag{1}$$

The bulk thermal conductivity of the TIM depends on the thermal conductivity of the binder(s) and the fillers(s), as well as on their relative concentrations. There are many theoretical and empirical models for predicting the thermal conductivity of such a two-phase system (i.e., filler and binder). In a typical TIM having a resin binder, the bulk thermal conductivity of the filler will be substantially greater than the bulk thermal conductivity of the binder, and the bulk thermal conductivity of the TIM increases rapidly at high filler volume loadings. Thus, in some embodiments, it is preferable to have a volume percent of filler that is greater than about 60%, in some embodiments greater than about 80%, in some embodiments greater than about 87%, and in some embodiments greater than about 94%; wherein the volume percent of the filler is equal to 100 times the volume of the filler in the TIM divided by the total volume of the TIM. The total volume of the TIM includes the volume of the filler, the binder, and any additional components that may be present in the TIM.

Although increasing the volume percent of the filler generally increases the bulk thermal conductivity of a TIM, higher filler concentrations may have a detrimental effect on the viscosity of the TIM. Typically, filled materials are shear-thinning (i.e., non-Newtonian) fluids; therefore, a single numerical value cannot adequately describe the complex relationship between filler loading and viscosity. Generally, viscosity data collected at a single shear rate show that the viscosity of the TIM at that given shear rate increases dramatically as the volume percent of the filler approaches the maximum packing density of the filler.

Viscosity data of shear-thinning fluids also show that the viscosity decreases with increasing frequency of oscillation (e.g., in a dynamic viscosity test) or increasing shear rate (e.g., in a steady state viscosity test). The shear rate under a static pressure, typical of the pressure applied by clips connecting a heat sink to a heat-generating component, is very low, e.g., in the range of $10^{-6}$ to $10^{-4}$ $s^{-1}$. Therefore, the viscosity of a typical TIM is expected to be very high under typical application conditions.

Generally, a TIM is placed on a surface of the heat-generating component, the heat sink, or both. TIMs may be applied as a liquid directly onto the heat sink or heat-generating component or pre-formed into a film and then transferred to the heat sink or heat-generating component. Liquid TIMs include filled and unfilled greases, putties, gels, caulks, pastes, and the like. A drop of liquid, often called a dollop, can be applied manually or with a liquid dispensing system. Typically, the dollop is placed approximately in the center of the heat sink or heat-generation component and the process of urging them together during mounting squeezes the liquid TIM spreading it over a larger area. The liquid TIMs are normally viscous non-Newtonian fluids, so they generally retain their shape and location after being compressed into a layer.

In some embodiments, a layer of TIM can be formed by stenciling or screen printing a liquid TIM material onto the heat sink or the heat-generating component using well-known methods. In addition, a pre-formed film of TIM can be made by coating a liquid TIM between release liners in a separate step followed by application of the film to the heat sink in a later step. Some of these pre-formed film TIMs are coated onto carrier films such as aluminum foil or polyimide film for improved handling performance and/or improved heat spreading. In some embodiments, film TIMs may have a layer of adhesive (e.g., pressure sensitive adhesive) on one or both sides. Some liquid TIMs require heat to coat them into thin films and appear solid when cooled down to room temperature.

After application of the TIM, the heat-generating component and the heat sink are brought together. The surface of the heat-generating component and the heat sink are separated by the layer of TIM at a distance fixed by the thickness of the layer of TIM. A static pressure is then applied and this gap between the heat-generating component and the heat sink is reduced as they are urged together.

Static pressures between the heat sink and the heat-generating component may be generated by attaching the heat sink to the substrate with mechanical devices (e.g., rivets, clips, clamps, and threaded fasteners), wherein the heat-generating component is positioned between the substrate and the heat sink. Applying an additional load further urging the heat sink toward the heat-generating component may also generate static pressures.

The quantity of the TIM used in an application can vary. In some applications, the TIM material can be sufficient to cover the desired interfacial area and also have excess material that squeezes out as the heat sink and heat-generating components are urged together. TIM material that is not in the interface area between the heat-generating component and the heat sink does not significantly impact the thermal performance of the overall assembly. The excess TIM can be removed, if desired, by known methods (e.g.; wiping, scraping, etc.).

Generally, the static pressure required to urge the heat-generating component and the heat sink together is proportional to the viscosity of the TIM. Thus, in a system with only static pressure, a balance between the available force and the resistance to flow is eventually reached and a fixed gap remains. That is, initially the gap decreases but eventually it levels off at a gap determined by the balance of the static pressure and the viscous resistance to flow of the TIM between the surfaces of the heat sink and the heat-generating component. Generally, the higher the viscosity of the TIM at the shear rate generated by the applied static pressure, the higher the resistance force, which in turn results in a larger gap for given applied static pressure.

The resistance to flow of higher viscosity TIMs, such as TIMs having higher filler loadings, may also result in less complete filling of the irregularities in the surfaces of the heat sink and the heat-generating component.

Typical heat-generating components include central processing units (CPU) and application specific integrated circuits (ASIC). Generally, the maximum practical static pressure on a CPU or ASIC is in the range of 175–207 kPa (25 to 30 psi), although pressures as high as 700 kPa (100 psi) may be used in some applications. At forces substantially higher than this, the CPU or ASIC package may not be able to support the pressure without damage to the chip inside the package. Bare chips or flip chips are even more susceptible to damage from high pressures due to the lack of a package around such integrated circuits. Typically, for most TIMs the thickness versus pressure curve levels off at pressures higher than this practical limit.

Sonication is the process of applying periodic forces. Generally, the periodic force has a primary frequency and, in some embodiments, harmonics of the primary frequency. The primary frequency may be subsonic, sonic, or ultrasonic. Sonic forces have a primary frequency of about 20 Hz to about 20,000 Hz. In some embodiments, sonic forces having a primary frequency of about 20 Hz to about 1000 Hz are preferred. Subsonic forces have a primary frequency of less than 20 Hz, typically about 5 Hz to less than 20 Hz. Generally, forces having a primary frequency of less than 1 Hz, as may be found with agitation, are less preferred.

The sonication of a TIM using subsonic and/or sonic forces while applying a static force has been found to rapidly reduce the thermal resistance of an assembly comprising a heat sink, a TIM, and a heat-generating component. While ultrasonic forces (i.e., forces having a primary frequency of greater than about 20,000 Hz) may be useful in some applications, such forces are less preferred. Generally, the equipment required to generate ultrasonic forces is more complicated, and thus more expensive, while providing little additional benefit. In addition, components such CPU and ASIC packages are designed to withstand normal shocks and vibrations encountered during use. Generally, the frequency of such vibrations is less than about 1000 Hz. In contrast, high frequency forces, including ultrasonic forces, will be more likely to damage these vibration sensitive components.

The subsonic and/or sonic forces may be applied to the TIM via any known means. In some embodiments, the forces are applied by physically contacting a vibrating device and one or more elements of the heat sink assembly. In some embodiments, the vibrating device may be in physical contact with another component (e.g., a cooling fan, a clip or other mechanical attachment means, or a circuit board) that itself is in physical contact with one or more elements of the heat sink assembly. Exemplary vibrating devices include handheld tools such as an engraver, a reciprocating tool, a pneumatic tool, piezoelectric transducers, and the like.

Sonication may result in one or more of tensile, compressive, shear, and torsional forces in the TIM.

In some embodiments, the forces are indirectly applied to the heat sink assembly. For example, a device may be used to impinge air or other fluids onto the heat sink assembly or an element in contact with the assembly, wherein the force of impingement oscillates within the desired frequency range.

In some embodiments, sonication provides a means to lower the thermal resistance of an assembly. In some embodiments, sonication can densify the TIM. In some embodiments, sonication can reduce the nominal thickness of the TIM. In some embodiments, sonication can drive air or voids from the TIM and/or drive the TIM into the surface features (including random surface irregularities) of the heat sink and/or the heat-generating component, displacing air.

In some embodiments, sonication can provide a means by which the density of the TIM is increased as compared to the density of the TIM as originally applied. In some embodiments, sonication drives voids, air and/or more mobile resins components from the TIM. The reduction in the relative proportion of these elements of a TIM contributes to an increase in the density of the TIM after sonication. In some embodiments, the relative density of the TIM following sonication is increased by at least about 0.5%, in some embodiments, by at least about 2%, in some embodiments, by least about 5%, and even by at least about 15% using the TIM sonication method as compared to a method where static pressure alone is used.

In some embodiments, sonication can be used to increase the concentration of the filler particles in the TIM. In some embodiments, as sonication occurs, the less dense components of the TIM are preferentially removed from the interface between the heat sink and the heat-generating component. The remaining TIM then contains a higher concentration of the more dense fillers than the original TIM.

In some embodiments, the TIM sonication method can also provide preferential alignment or organization of the fillers in a TIM. In some embodiments, TIM sonication aligns the particles in the highest density packing order based on the shapes of the fillers in the TIM as compared to assembly methods where pressure alone is used.

In some embodiments, sonication is useful to aid in thinning the layer of TIM, including TIMs that have higher filler loadings. In some embodiments, sonication thins the layer of TIM including TIMs having a high viscosity that static pressure alone would not thin as quickly or as completely. In some embodiments, the relative nominal thickness of the TIM is decreased by at least about 5%, in some embodiments, by at least about 10%, in some embodiments, by at least about 25%, and even by about 50% using sonication as compared to a method where static pressure alone is used.

In the absence of sonication, the assembly thermal resistance may improve with time but the time required to reach steady state may be excessively long (e.g., hours, days, or even weeks). Also, achieving steady state may require many on-off cycles. In some embodiments, sonication may provide a rapid reduction in the thermal resistance of an assembly. In some embodiments, the desired reduction in thermal resistance means can be accomplished in less than about one minute, in some embodiments, less than about thirty seconds, in some embodiments, less than about ten seconds, and even less than about five seconds.

In some embodiments, sonication allows the use of non-metallic binder based TIMs having a higher bulk thermal conductivity (k) than is practical when static pressure alone is used. In some embodiments, TIMs having a k greater than about 1 W/mK, in some embodiments, greater than about 3 W/mK, in some embodiments, greater than about 7 W/mK, and even greater than about 8 W/mK.

In some embodiments, sonication provides one or more of these advantages relative to a system using static pressure alone even when the TIM is heated.

In some embodiments, multiple sonication steps may be used. The amplitude, frequency, and duration may be independently selected for each sonication.

EXAMPLES

The following specific, but non-limiting, examples will serve to illustrate the invention.

The test apparatus contained the following components:

(1) A heat sink/fan assembly, including mounting clips (Premium Copper Pentium 4 CPU Heat Sink+Fan Socket 423/478: ID number FAN478XP, commercially available from StarTech Company, Groveport, Ohio). As delivered, the heat sink/fan assembly included a plastic mounting part used to mount the heat sink/fan assembly. The heat sink/fan assembly was modified by machining a 0.76 mm (30 mil) square groove into the exposed face of the heat sink such that the groove extended from a side of the heat sink to the center of the heat sink face.

(2) A fan power supply (manufactured by Metronix, Braunscheiwg, Germany) used to operate the fan of the heat sink/fan assembly at 5.0 volts and 0.12 amps.

(3) A cubic copper block 2.5 cm (1 inch) per side with two machined features: (i) a center hole located in one side to hold a 2.5 cm (1.0 inch) long by 0.64 cm (0.25 inch) diameter cylindrical cartridge heater (FIREROD, part number E1A53-12, 120 volts, 150 watts, available from Watlow Electric, St. Louis, Mo.) and (ii) a small, narrow hole located near the top surface of a side of the copper block adjacent to the side containing the center hole and sized to hold a thermocouple. Thermal grease (Wakefield Thermal Compound Part Number 120-8, available from Wakefield Engineering, Pelham, N.H.) was used to place the heater cartridge into the copper block.

(4) A cartridge heater power supply (Variable Autotransformer Type 033-3504, input 120 volts, output 0–140 volts, 10 amps, 50–60 Hz, 1.4 KVA, 100 watts, available from Staco Energy Products, Dayton, Ohio).

(5) Two thermocouples (part number: 5SC-TT-K-36-36, available from Omega Engineering Inc., Stamford Conn.). One thermocouple was attached to the face of the heat sink in the machined groove using a thermally conductive epoxy (TC-2810 from 3M Company, St. Paul, Minn.). The second thermocouple was inserted into a hole in the copper block, using a thermal grease (Wakefield Thermal Compound Part Number 120-8).

(6) A thermocouple reader (Omega Model HH-22 Digital Thermometer with dual inputs, available from Omega Engineering Inc., Stamford, Conn.) to which the thermocouples were attached.

(7) A lab jack vertical stage available from VWR International, Batavia, Ill.

(8) A pressure sensor assembly (Model 839 Four-Channel Display, Model 833 Capacitance-to-Voltage Converters attached to Model 864 Wafer Sensors, all available from Loadstar Sensors, Inc., Sunnyvale, Calif.).

(9) A 16.5 cm (6.5 inch) long×8.9 cm (3.5 inch) wide×20 cm (8 inch) high aluminum metal frame prepared from 1.3 cm (0.5 inch) thick aluminum sheet.

(10) A 7 cm (2.75 inch) long×5 cm (2 inch) wide×3.8 cm (1.5 inch) high insulated holder.

(11) A Dremel engraver Model 290-01, 120V-0.2 A 60 HZ (available from Dremel Company, Racine, Wis.), used as a sonication tool.

Test Apparatus Set-Up

Figure 2:
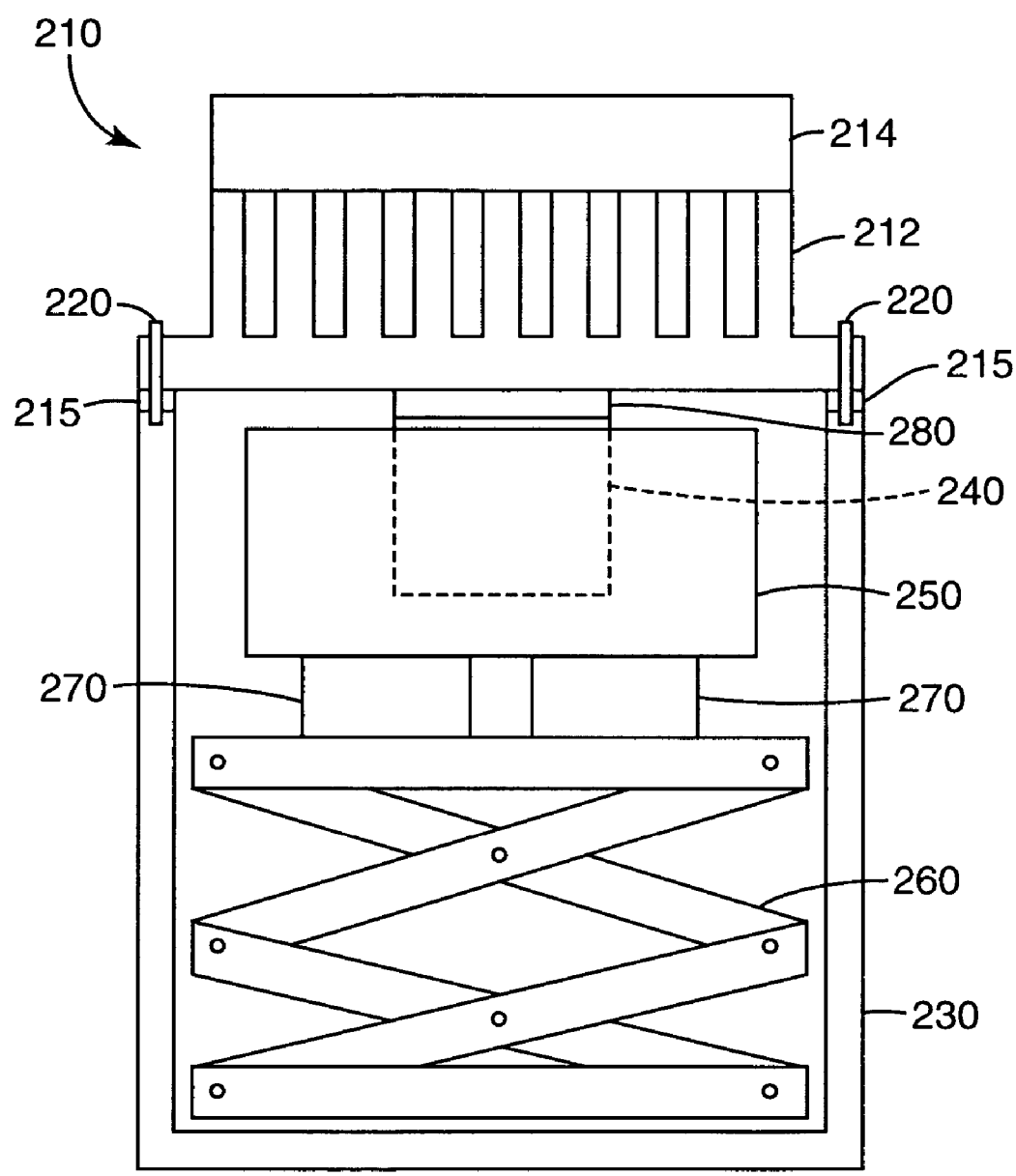
FIG. 2 is a schematic diagram of the test apparatus.

A schematic of the test apparatus is shown in FIG. 2. Referring to FIG. 2, plastic mounting part 215 was attached to aluminum frame 230. Heat sink/fan assembly 210, comprising heat sink 212 and fan 214, was attached to plastic part 215 via spring clips 220, and connected to the fan power supply (not shown). Copper block 240, containing a cylindrical cartridge heater (not shown), was set into the insulated holder 250 so that the top surface of copper block 240 was exposed. The cartridge heater was connected to the cartridge heater power supply (not shown). Insulated holder 250 was then positioned on top of wafer sensors 270, which were connected to the pressure sensor assembly (not shown). The wafer sensors/insulated holder/copper block assembly was placed on top of lab jack 260, which was positioned below the heat sink/fan assembly 210. The thermocouples (not shown) were inserted into copper block 240 and the heat sink 212, and connected to the thermal couple reader (not shown).

General Test Procedure

A sample of TIM 280 to be tested was placed onto the exposed face of copper block 240. The TIM sample size was sufficient to cover the entire face of the copper block once the heat sink/fan assembly was contacted with the copper block and static pressure applied. Lab jack 260 was raised vertically until a desired initial pressure was reached as indicated on the pressure sensor display. A portion of the TIM was allowed to squeeze-out from between the copper block and heat sink assembly. The cartridge heater power supply was turned on and set to the desired power input (approximately 100 watts) and the fan was turned on. The pressure and the temperatures of the copper block ($T_{CB}$) and the heat sink ($T_{HS}$) were recorded at various intervals until such time that the temperatures were deemed to have reached steady state (Initial Steady State). The fan was then turned off.

Sonication was then applied to the heat sink using the Dremel engraver set at Level 3. The primary frequency was 120 Hz. The blunt tip of the engraver was pressed against the side of the cooling fan at a point that was approximately 1.9 cm (0.75 inch) above the plane of the interface between the heat sink/fan assembly and the copper block. The engraver was held in place for various times as specified in the Examples. The engraver was then removed, and the cooling fan was turned back on. Temperatures $T_{CB}$ and $T_{HS}$ and pressure were again recorded at various intervals until such time that the temperatures were deemed to have reached steady state.

The thermal resistance of the TIM was calculated according to Equation 2:

$$\text{Thermal Resistance} = (T_{CB} - T_{HS})/\text{Power}; \qquad (2)$$

where $T_{CB}$ and $T_{HS}$ and are in units of ° C., and power is in units of Watts.

Materials Used in the Examples

Certain commercially available materials were used in the Examples of the invention, as summarized in Table 1.

TABLE 1

Description of thermal interface materials.

| TIM I.D. | Trade Designation | Description | Source |
|---|---|---|---|
| A | Artic Silver Ceramique ™ | White silicone thermal grease containing aluminum oxide, boron nitride, and zinc oxide sub-micron particles, avg. particle size <0.38 microns | Artic Silver Inc., Visalia, California |
| B | TIM-514 | Black thixotropic silicone thermal paste containing highly conductive ceramic particles, specific gravity 1.7 | Timtronics, Yaphank, New York |
| C | Wakefield Series 120 Thermal Joint Compound | Opaque white grease-like material containing zinc oxide in a silicone oil carrier, specific gravity 2.1 | Wakefield Engineering, Pelham, New Hampshire |
| D | AOS Micro-Faze ™ A4 Part number A4-6000-6000 | Dry film interface material, die-cut 0.002 inch thick aluminum foil substrate coated on both sides with 0.001 inch thick naturally tacky thermal grease covered with a liner | AOS Thermal Compounds, Eatontown, New Jersey |

Determination of Percent Filler Content

The weight percent filler loading of the liquid TIMs was measured as follows. An empty ceramic cup was weighed and the weight was recorded as W1. Then, a quantity of liquid TIM to be tested was added to the empty ceramic cup and the weight of the cup containing the TIM was recorded as W2. The cup containing the TIM was placed in a TEMCO Muffle Furnace, Model 1500, manufactured by Thermo Electric Mfg. CO., Dubuque, Iowa, and heated to about 540° C. for one hour to burn off the binder. The cup was removed from the oven and allowed to dwell at ambient temperature for about 35 minutes. Then the cup was weighed and the weight was recorded as W3. The weight percent filler content was calculated using Equation 3

$$\text{Weight Percent Filler Content} = [(W3 - W1)/(W2 - W1)] \times 100. \qquad (3)$$

TABLE 2

Weight percent of filler in liquid thermal interface materials.

| TIM I.D. | W1 (g) | W2 (g) | W3 (g) | Filler Content (wt. %) |
|---|---|---|---|---|
| A | 29.9518 | 30.9778 | 30.7702 | 79.77 |
| B | 31.4575 | 32.5361 | 32.1268 | 62.05 |
| C | 30.1663 | 31.1687 | 31.007 | 83.87 |
| Ex. 3 | 31.7214 | 32.7514 | 32.6993 | 94.94 |

Example 1

A stencil, prepared by die cutting a 19 mm (0.75 inch) diameter circular opening in the center of a 76 micron (0.003 inch) thick polyester (PET) film, was taped onto the exposed surface of the heat sink so that the opening was approximately centered on the heat sink surface, and a dollop of liquid TIM C was placed into the opening. A metal spatula was used to squeegee-off the excess in a process commonly known as stenciling. The PET film was removed, leaving the grease in a 76 micron (0.003 inch) thick, 19 mm (0.75 inch) diameter circular layer on the heat sink.

In addition, a compliant material (Plastigauge Plastic Precision Clearance Gauge, available from Plastigauge Manufacturing Co, West Sussex, United Kingdom) was used to measure the thickness of the TIM. A sample of the Plastigauge was placed on top of the stenciled TIM. As pressure was applied, the Plastigauge was compressed to the thickness of the gap between the heat sink and the copper block, i.e., the thickness of the TIM.

The thermal resistances of TIM C before and after sonication were determined according to the test method described above except that a Commtest MMS™ 3000 Series Data Logger temperature-logging instrument (manufactured by Commtest Instruments Ltd., Christchurch, New Zealand) was used in place of the Omega Model HH-22 Digital Thermometer. $T_{CB}$ and $T_{HS}$ were measured every two seconds. The power was measured (a) at the start the test, (b) just before sonication, (c) just after sonication, and (d) at the termination of the test. The power varied slightly ranging from 98 to 102 Watts.

Figure 3:
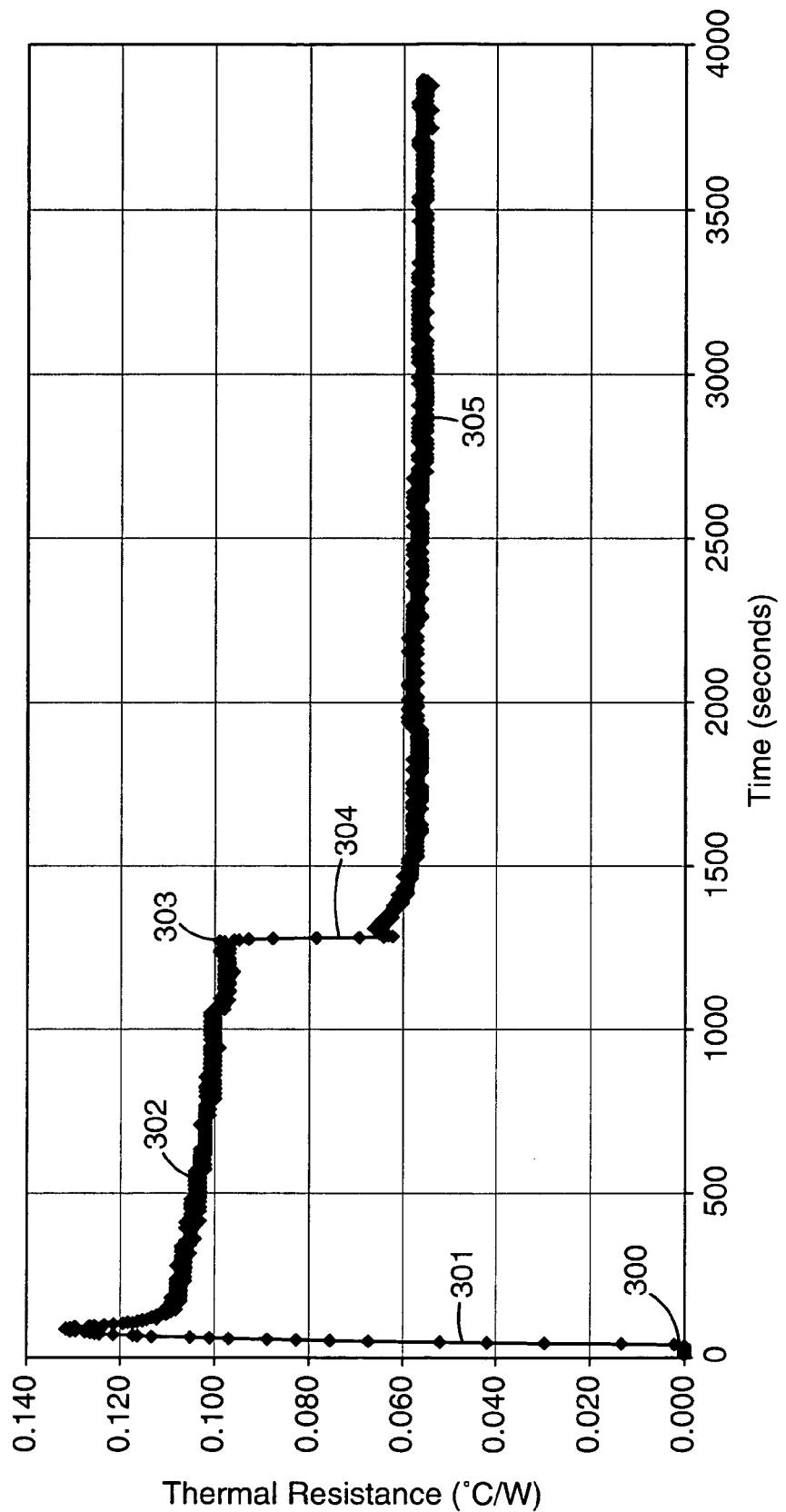
FIG. 3 is a plot of thermal resistance versus time for a commercially available liquid TIM sonicated for ten-seconds.

The lab jack was raised until an initial pressure of about 172 kPa (25 psi) was reached. Thermal resistances were calculated using Equation 2 and are shown in FIG. 3. Referring to FIG. 3, after achieving the initial pressure, the heater power supply was turned at point 300, and the thermal resistance rose to about 0.13° C./W within ninty seconds, as shown by line 301. Within about 1000 seconds (approximately seventeen minutes), the thermal resistance declined to reach Initial Steady State at about 0.098° C./W, as shown by line 302. At approximately 1270 seconds (point 303), the fan was stopped and sonication was applied for about ten seconds. As shown by line 304, the thermal resistance rapidly dropped from about 0.095° C./W to about 0.064° C./W during the sonication. The fan was restarted, and the thermal resistance continued to decrease to a steady state value of about 0.056° C./W, as shown by line 305.

At the end of the test, the thickness of the Plastigauge sample was about 48.3 microns (0.0019 inch). Thus, the TIM reduced in thickness from an initial thickness of 76 microns (0.003 inch) before sonication to about 48.3 microns after sonication.

Example 2

Figure 4:
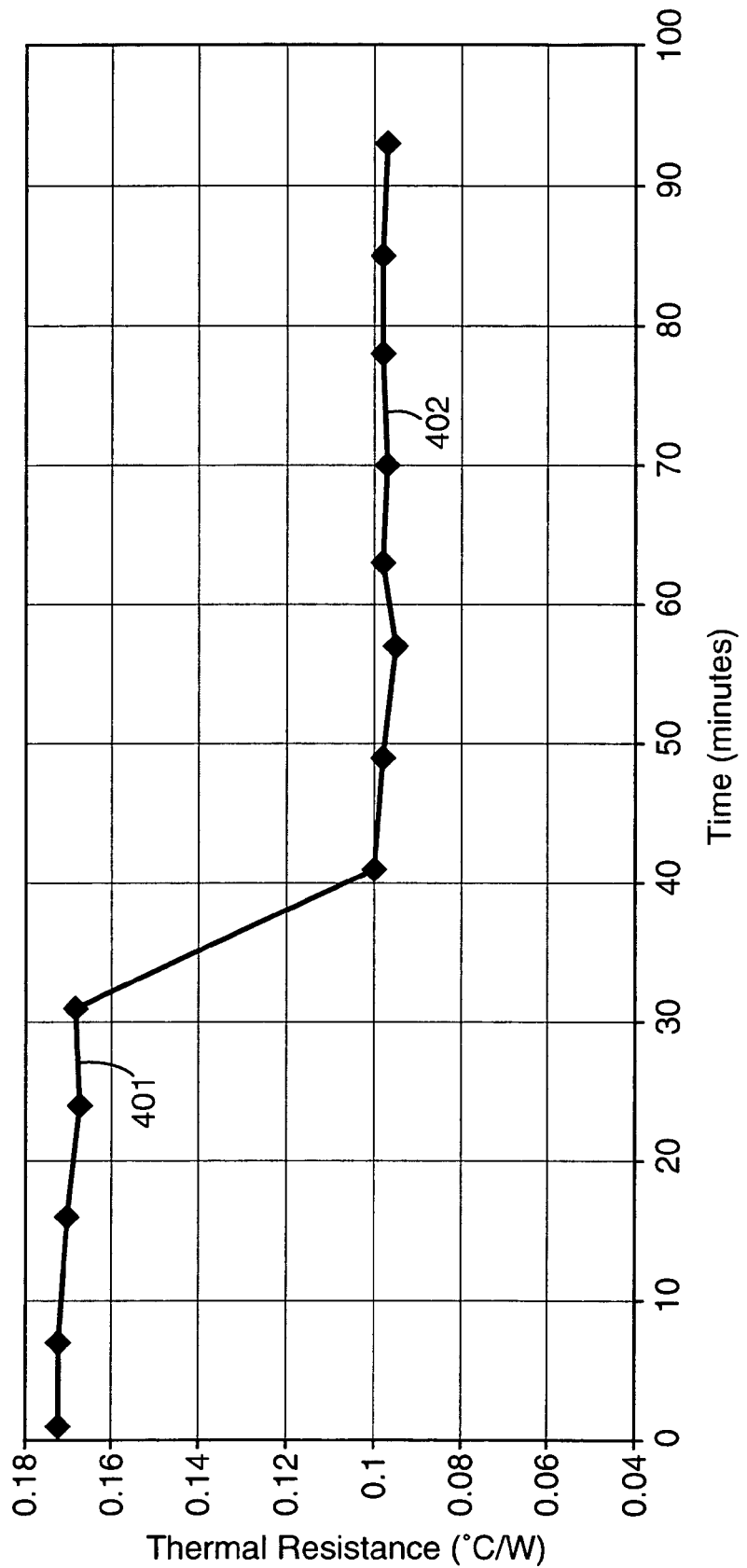
FIG. 4 is a plot of thermal resistance versus time for a commercially available liquid TIM sonicated for four-seconds.

The thermal resistances of liquid TIM A before and after sonication were determined according to the test method described above. TIM A was applied as a dollop on the copper block and spread out into a thin film that covered the copper block surface. The lab jack was raised until an initial pressure of about 103 kPa (15 psi) was reached. Temperature data were collected periodically, and thermal resistances were calculated using Equation 2. Referring to FIG. 4, Initial Steady State was reached within about thirty minutes, as shown by line 401. Sonication was then applied for about four seconds. The reduction in thermal resistance after sonication is shown by line 402.

Example 3

A TIM composition was prepared by combining TIM B and about 33 wt % 15% Ag coated Cu particles in an open vessel with hand mixing until a uniform putty was obtained. The silver-coated copper particles had an apparent density 2.4 g/cm³, a screen analysis (mesh) of 65% (325), and were obtained from Novamet Specialty Products Corporation, Wyckoff, N.J. The Determination of Percent Filler Content procedure was used to determine the final filler concentration. The data are reported in Table 2. The resulting composition contained about 95 wt % filler. A dollop of the putty was placed on the copper block.

The thermal resistance of the TIM composition before and after sonication were determined according to the test method described above with the following exceptions: (a) after the first sonication, the pressure force was restored to the initial pressure force; and (b) once steady state conditions were reached after restoring the pressure force in (a), the fan was turned off, a second sonication was applied, and the fan was turned back on.

Figure 5:
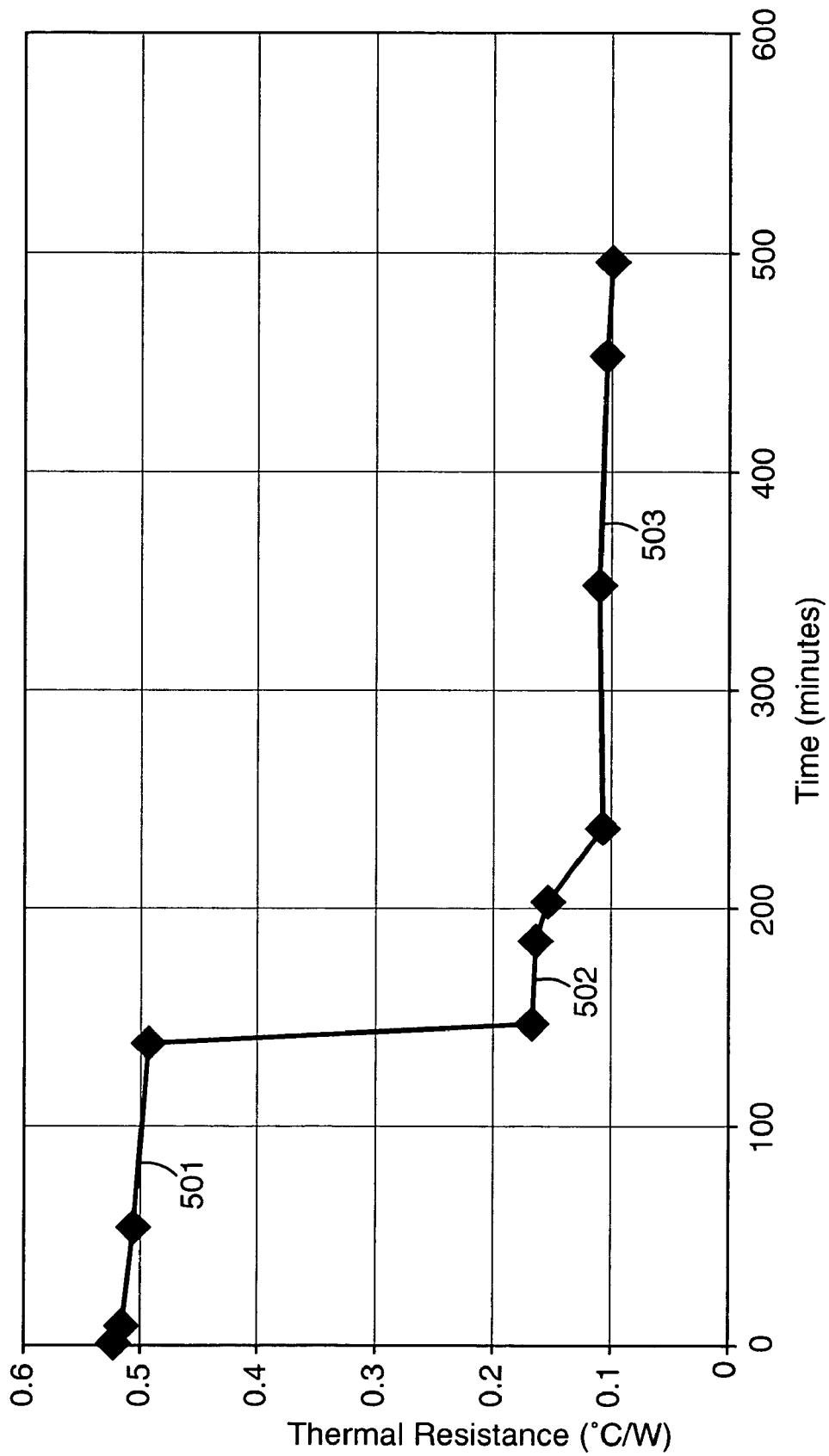
FIG. 5 is a plot of thermal resistance versus time for a modified commercially available liquid TIM subjected to two, four-second sonications.

The lab jack was raised until the initial pressure of about 103 kPa (15 psi) was reached. Referring to FIG. 5, Initial Steady State was reached within about 140 minutes, as shown by line 501. A first sonication was applied for about four seconds. The reduction in the thermal resistance of the TIM after the first sonication is shown by line 502. The lab jack was raised to restore the pressure to about 103 kPa (15 psi), as the pressure had dropped to about 56 kPa (8.2 psi) after the first sonication. This change in pressure is believed to have resulted from a decrease in the thickness of the layer of TIM. Once steady state conditions were reached, a second sonication was applied for about four seconds. The reduction in the thermal resistance after the second sonication is shown by line 503.

Example 4

The thermal resistance of a commercially available thermally conductive film was determined before and after sonication according the test method described above. A tab of pressure sensitive adhesive (PSA) tape was applied to the release liner present on each side of a 2.5 cm (one inch) square piece of TIM D film. The white release liner was removed by pulling on both tape tabs simultaneously. The sample was then placed on the copper block, pressed in place, and the remaining clear release liner was carefully removed without disturbing the TIM.

Figure 6:
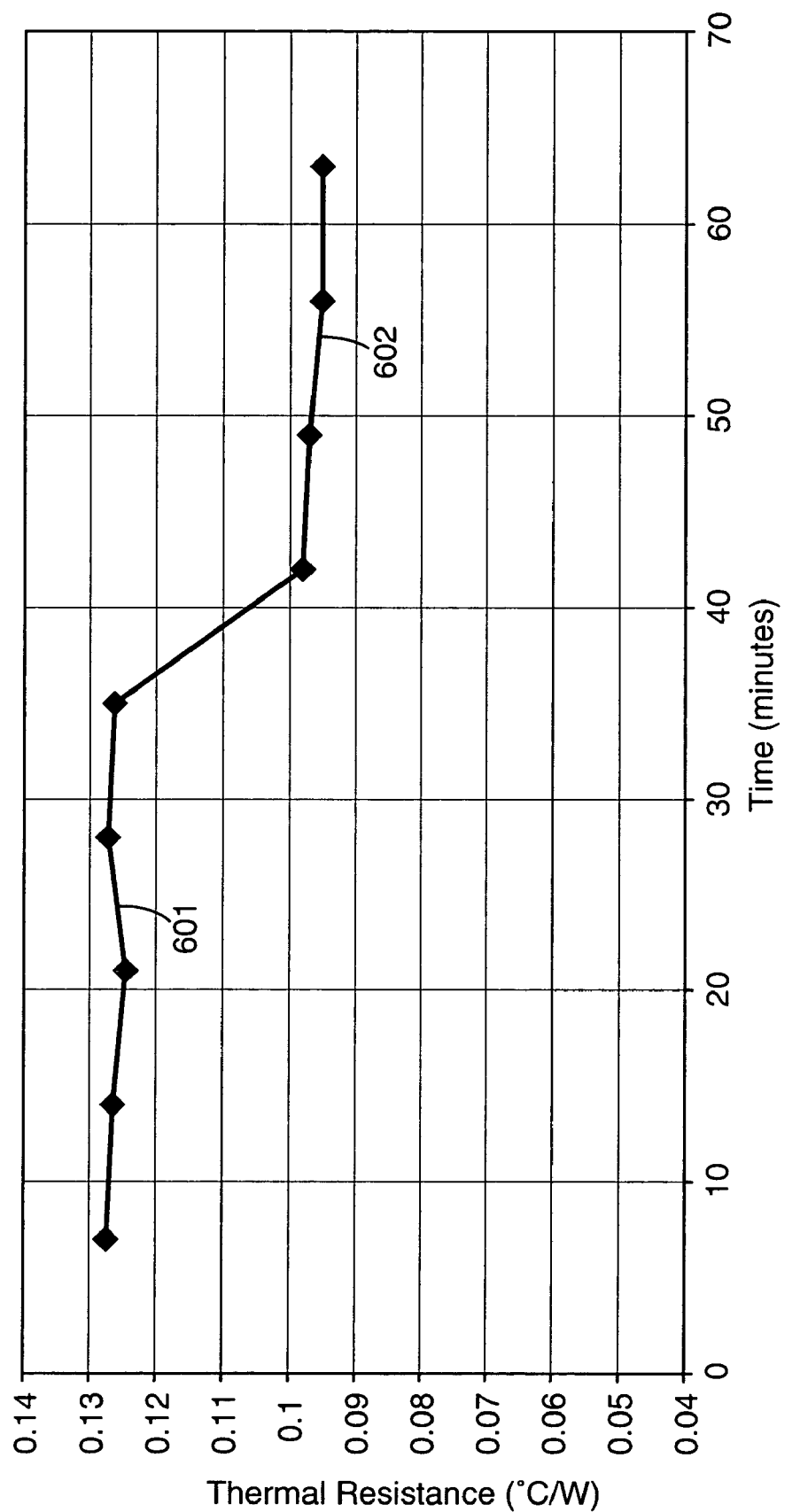
FIG. 6 is a plot of thermal resistance versus time for a commercially available film TIM sonicated for six seconds.

The lab jack was raised until an initial pressure of about 151 kPa (22 psi) was reached. Referring to FIG. 6, Initial Steady State was reached within about thirty-five minutes, as shown by line 601. Sonication was applied for about six seconds. The reduction in thermal resistance after sonication is by line 602.

Example 5

The effect of an additional step of heating a TIM before sonication on the thermal resistance of a commercially available thermally conductive film was determined. The test apparatus set-up was as described above.

A sample of the TIM D film was prepared and applied to the copper block as described in Example 4. The TIM was tested as described in Example 4 with the following exceptions: (a) after Initial Steady State was reached and the cooling fan was turned off, the temperature of the copper block was allowed to climb until it reached 100° C., after which the fan was turned on; and (b) after the first sonication step, steady state was reached, the fan was turned off, a second sonication of about four seconds was applied, and then the fan was turned on.

Figure 7:
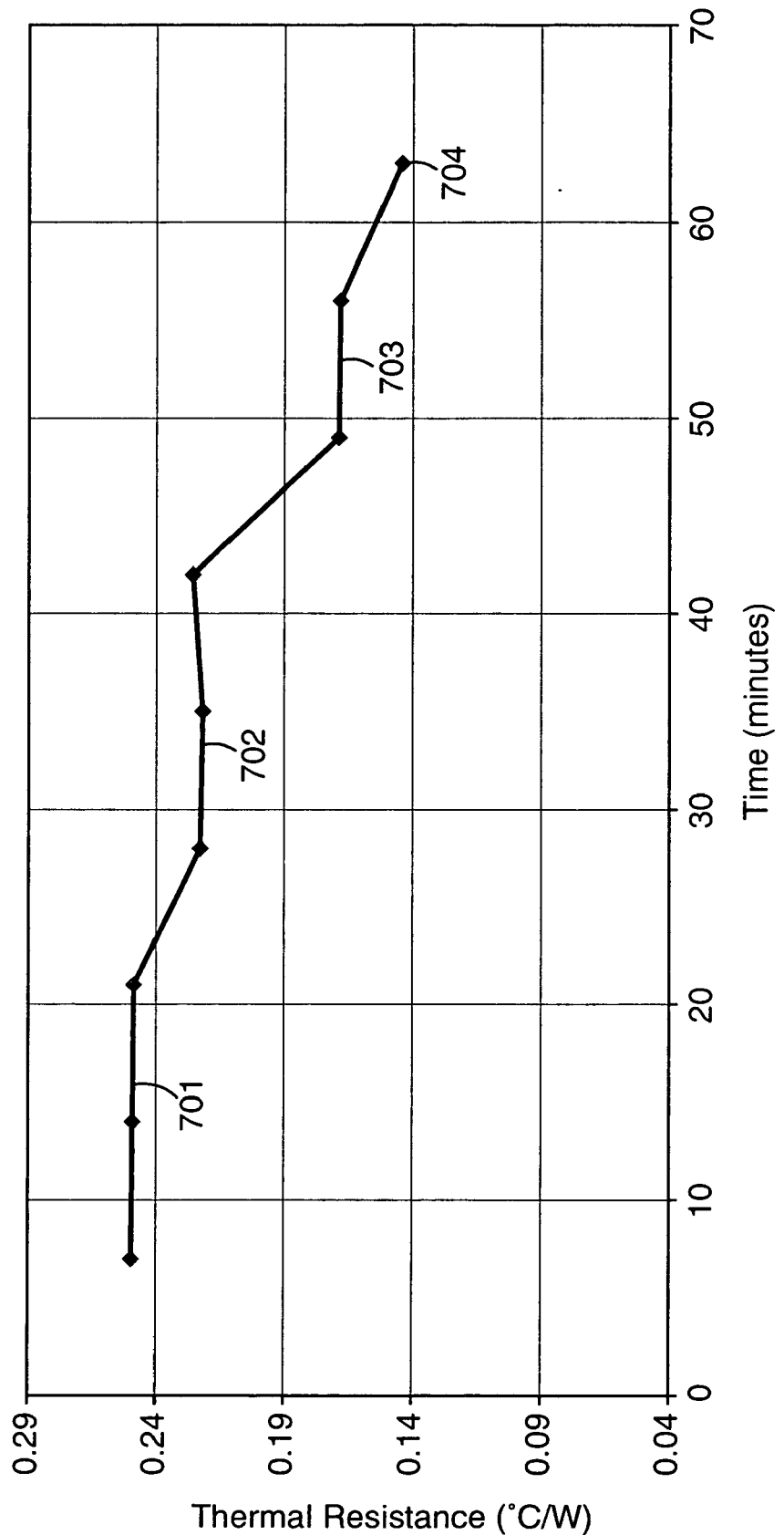
FIG. 7 is a plot of thermal resistance versus time for a commercially available film TIM preheated under pressure and subjected to two sonications.

Referring to FIG. 7, the steady state thermal resistance before heating is shown by line 701 and the reduction in thermal resistance upon heating is shown by line 702. The reduction in thermal resistance achieved after the first sonication is shown by line 703, and the further reduction in thermal resistance achieved after the second sonication is shown by point 704. As shown in FIG. 7, a modest improvement in thermal performance resulted from the heat cycle, but a more substantial improvement in thermal performance resulted from the first sonication. The subsequent sonication demonstrated an additional improvement in thermal performance.

Example 6

The effect of an additional step of heating a TIM before applying the initial pressure on the thermal resistance of a commercially available thermally conductive film was determined. The Thermal Resistance test apparatus set up was as described above.

A sample of the TIM D film was prepared and applied to the copper block as described in Example 3. The TIM was tested as described in Example 4 with the following exceptions: (a) the copper block was heated to 150° C. before an initial pressure of about 165 kPa (24 psi) was applied; (b) the first sonication lasted about ten seconds; and (c) after the first sonication steady state was reached, the fan was turned off, a second sonication lasting about ten seconds was applied, and then the fan was turned on.

Figure 8:
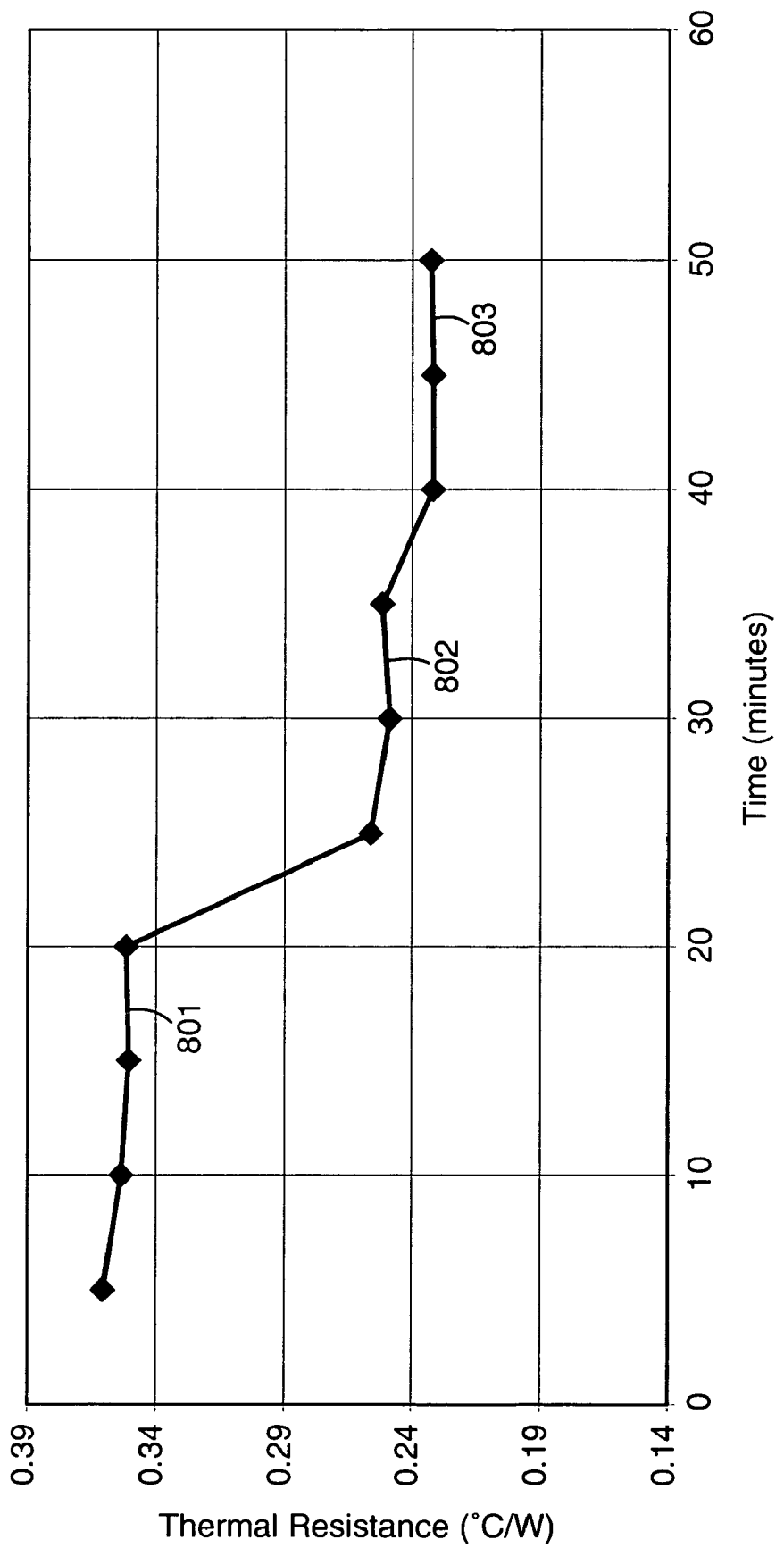
FIG. 8 is a plot of thermal resistance versus time for a commercially available film TIM preheated and subjected to two sonications.

Referring to FIG. 8, the steady state thermal resistance after heating is shown by line 801. The reduction in thermal resistance achieved after the first sonication is shown by line 802, and the further reduction in thermal resistance achieved after the second sonication is shown by line 803. A substantial improvement in thermal performance resulting from the first sonication occurred even after pressing the TIM in place at elevated temperature. The subsequent sonication demonstrated an additional improvement in performance.

Example 7

The effect of longer sonication on the thermal resistance of a commercially available thermally conductive film was determined. A sample of the TIM D film was prepared and mounted in the test bed as described in Example 4. Sonication was applied for about thirty seconds, as described in Example 4.

Figure 9:
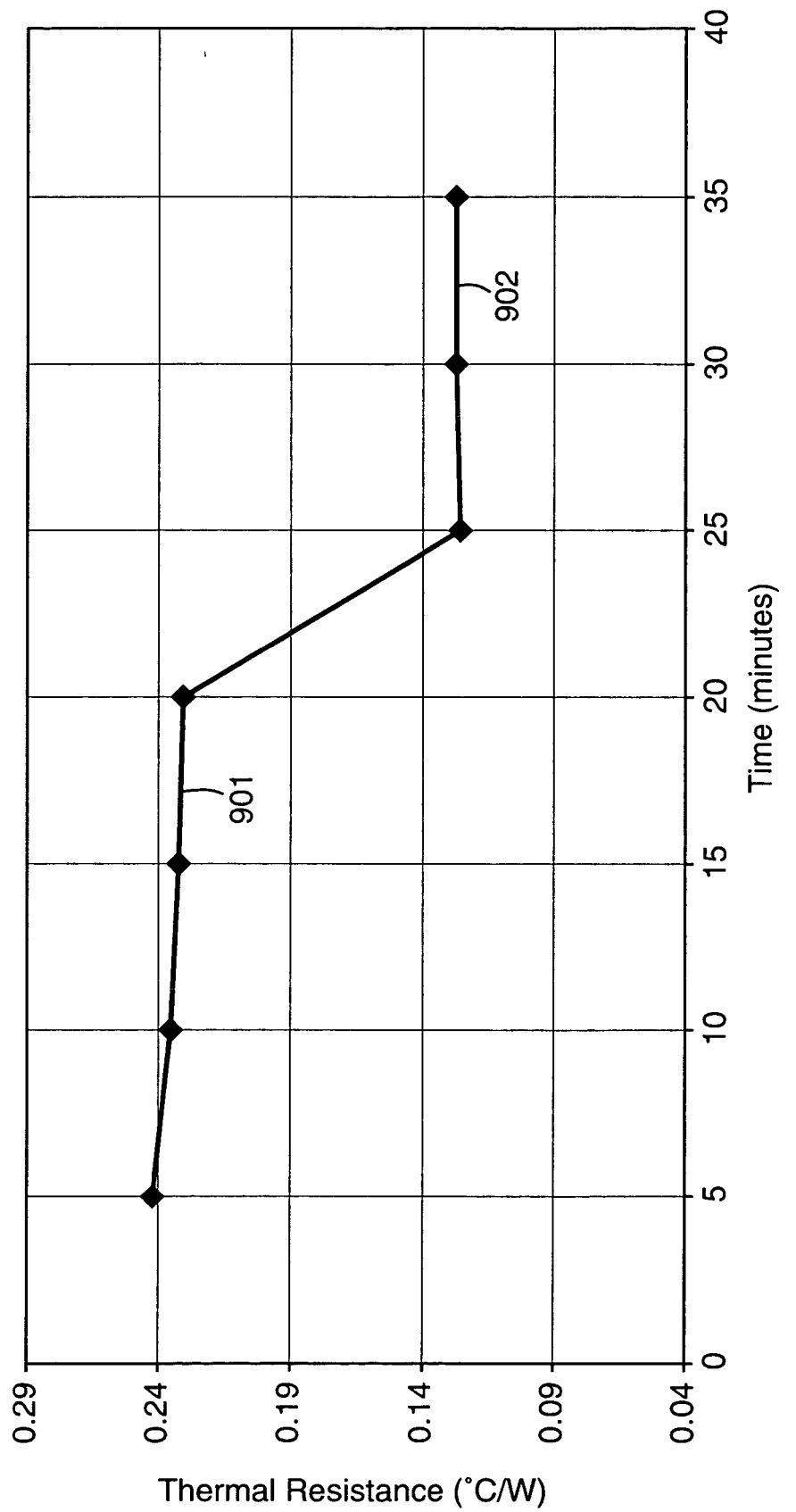
FIG. 9 is a plot of thermal resistance versus time for a commercially available film TIM sonicated for thirty seconds.

Referring to FIG. 9, the steady state thermal resistance prior to the extended sonication is shown by line 901. The reduction in thermal resistance achieved after the extended sonication is shown by line 902.

Example 8

A stencil, prepared by die cutting a 19 mm (0.75 inch) diameter circular opening in the center of a 76 micron (0.003 inch) thick polyester (PET) film, was taped onto the exposed surface of the heat sink so that the opening was about centered on the heat sink surface, and a dollop of liquid TIM C was placed into the opening. A metal spatula was used to squeegee-off the excess in a process commonly known as stenciling. The PET film was removed, leaving the grease in a 76 micron (0.003 inch) thick, 19 mm (0.75 inch) diameter circular layer on the heat sink.

The thermal resistances of TIM C before and after sonication were determined according to the test method described above except that a Commtest MMS™ 3000 Series Data Logger temperature-logging instrument (manufactured by Commtest Instruments Ltd., Christchurch, New Zealand) was used in place of the Omega Model HH-22 Digital Thermometer. $T_{CB}$ and $T_{HS}$ were measured every 30 seconds.

Figure 10:
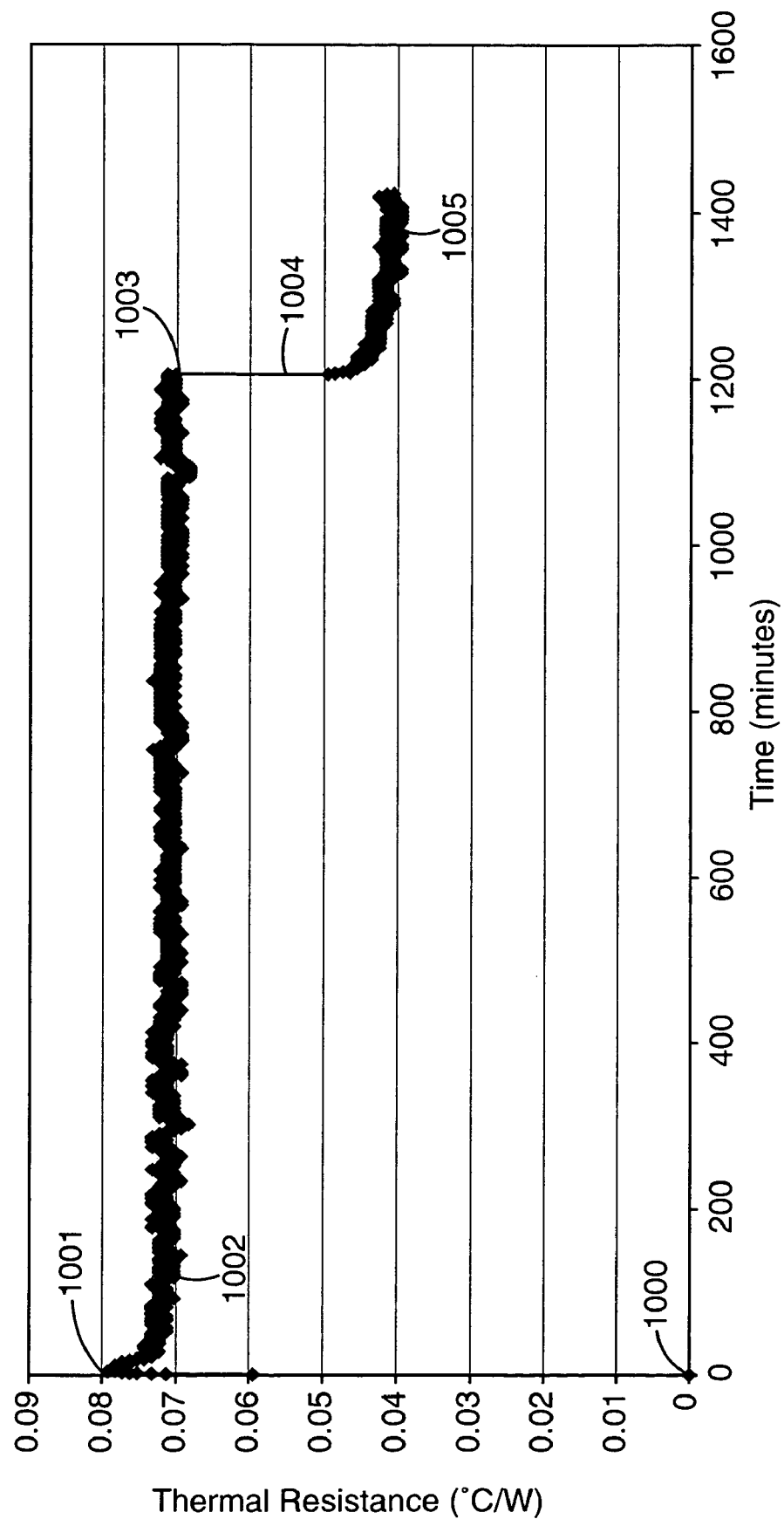
FIG. 10 is a plot of thermal resistance versus time for a commercially available liquid TIM held under pressure for twenty hours prior to sonication.

The lab jack was raised until an initial pressure of about 172 kPa (25 psi) was reached. Thermal resistances were calculated using Equation 2 and are shown in FIG. 10. Referring to FIG. 10, after achieving the initial pressure, the heater power supply was turned at point 1000, and the thermal resistance rose to about 0.079° C./W within five minutes seconds, as shown by line 1001. Within about 25 minutes the thermal resistance declined to reach Initial Steady State at about 0.074° C./W, as shown by line 1002. The apparatus was held at steady state for approximately twenty hours (1205 minutes) at which point the thermal resistance had only decreased to about 0.071° C./W. At the end of the approximately twenty hours (point 1003), the fan was stopped and sonication was applied for about four seconds. As shown by line 1004, the thermal resistance dropped from about 0.071° C./W to about 0.050° C./W within the thirty seconds between temperature measurements during which the sonication occurred. The fan was restarted, and the thermal resistance continued to decrease to a steady state value of about 0.041° C./W, as shown by line 1005.

Various modifications and alterations of this invention will become apparent to those skilled in the art without departing from the scope and spirit of this invention.

What is claimed is:

1. A method of coupling a heat sink to a heat-generating component comprising the steps of
    (a) providing an assembly comprising a thermal interface material between at least a portion of a first major surface of the heat sink and at least a portion of a first major surface of the heat-generating component;
    (b) urging the heat sink toward the heat-generating component while sonicating the thermal interface material with at least one of subsonic forces, sonic forces, or combinations thereof and
    (c) reducing the thermal resistance of the assembly.

2. The method of claim 1, wherein urging comprises applying a static pressure.

3. The method of claim 2, wherein the static pressure is no greater than about 175 kPa.

4. The method of claim 1, wherein the heat-generating component is mounted to a substrate, and urging comprises using a mechanical device to attach the heat sink to the substrate.

5. The method of claim 1, wherein the thermal interface material is sonicated with subsonic forces having a primary frequency of at least about 5 Hz and less than 20 Hz.

6. The method of claim 1, wherein the thermal interface material is sonicated with sonic forces having a primary frequency of at least about 20 Hz and less than about 20,000 Hz.

7. The method of claim 6, wherein the primary frequency is at least about 20 Hz and no greater than about 1000 Hz.

8. The method of claim 1, wherein the thermal interface material comprises a resin.

9. The method of claim 8, wherein thermal interface material further comprises a plurality of thermally conductive particles.

10. The method of claim 9, further comprising
(c) removing resin from between the heat sink and the heat source thereby increasing the concentration of particles in the thermal interface material.

11. The method of claim 1, wherein providing the thermal interface material comprises applying a liquid thermal interface material.

12. The method of claim 1, wherein providing the thermal interface material comprises applying a film of thermal interface material.

13. The method of claim 1, wherein the thermal interface material comprises an inorganic binder.

14. The method of claim 13, wherein thermal interface material farther comprises a plurality of thermally conductive particles, optionally wherein a plurality of particle compositions, shapes, sizes and/or size distributions are used.

15. The method of claim 14, further comprising
(c) removing inorganic binder from between the heat sink and the heat source thereby increasing the concentration of particles in the thermal interface material.

16. The method of claim 1, wherein the first major surface of the heat sink and the first major surface of the heat-generating component are substantially flat.

17. A heat sink assembly comprising
(a) a layer of thermal interface material between at least a portion of a first major surface of a heat sink and at least a portion of a first major surface of a heat-generating component, wherein
    (i) the first major surfaces of the heat sink and the heat-generating component are substantially flat,
    (ii) the thermal interface material comprises greater than 80% by volume thermally conductive particles, and
    (iii) the average thickness of the layer of thermal interface material is less than about 50 microns; and
(b) a mechanical device applying a static pressure urging the heat sink toward the heat-generating component, wherein the static pressure is less than 172 kPa.

18. The heat sink assembly according to claim 17, wherein the static pressure is less than 100 kPa.

19. The heat sink assembly according to claim 17, the thermal interface material comprises at least 87% by volume thermally conductive particles.

20. The heat sink assembly according to claim 17, wherein the bulk thermal conductivity of the thermal interface material is greater than 7 W/mK.

* * * * *

UNITED STATES PATENT AND TRADEMARK OFFICE
CERTIFICATE OF CORRECTION

PATENT NO.        : 7,169,245 B2  
APPLICATION NO.   : 11/010912  
DATED             : January 30, 2007  
INVENTOR(S)       : Cameron T. Murray Page 1 of 1

It is certified that error appears in the above-identified patent and that said Letters Patent is hereby corrected as shown below:

<u>Column 9</u>
Line 31, delete "0.2 A" and insert -- 0.2A --, therefor.

<u>Column 15</u>
Line 32, in Claim 14, delete "farther" and insert -- further --, therefor.

Signed and Sealed this

Twenty-fourth Day of June, 2008

JON W. DUDAS
*Director of the United States Patent and Trademark Office*